United States Patent
Kintis et al.

[19]

[11] Patent Number: 6,049,250
[45] Date of Patent: *Apr. 11, 2000

[54] DITTRIBUTED FEED BACK DISTRIBUTED AMPLIFIER

[75] Inventors: Mark Kintis, Manhattan Beach; Petar Tomasevic, Rancho Palos Verdes, both of Calif.

[73] Assignee: TRW Inc., Redondo Beach, Calif.

[*] Notice: This patent issued on a continued prosecution application filed under 37 CFR 1.53(d), and is subject to the twenty year patent term provisions of 35 U.S.C. 154(a)(2).

[21] Appl. No.: 09/054,934

[22] Filed: Apr. 3, 1998

[51] Int. Cl.$^7$ ..................................................... H03F 3/60
[52] U.S. Cl. ............................................. 330/54; 330/286
[58] Field of Search ............................. 330/54, 286, 295, 330/278, 282, 283

[56] References Cited

U.S. PATENT DOCUMENTS

| | | | |
|---|---|---|---|
| 3,222,611 | 12/1965 | Norton, Jr. | 330/54 |
| 4,103,245 | 7/1978 | Yokoyama | 330/265 |
| 4,631,493 | 12/1986 | Vendelin et al. | 330/277 |
| 4,918,401 | 4/1990 | Langer . | |
| 4,947,136 | 8/1990 | Helms . | |
| 5,208,547 | 5/1993 | Schindler | 330/54 |
| 5,274,339 | 12/1993 | Wideman et al. . | |
| 5,386,130 | 1/1995 | Gamand et al. . | |
| 5,412,347 | 5/1995 | Minnis . | |
| 5,414,387 | 5/1995 | Nakahara et al. . | |
| 5,559,472 | 9/1996 | Kobayashi . | |
| 5,694,085 | 12/1997 | Walker | 330/295 |
| 5,751,190 | 5/1998 | Nguyen et al. | 330/54 |

OTHER PUBLICATIONS

"Mesfet Distributed Amplifier Design Guidelines"; by Beyer, et al., *IEEE Transactions on Microwave Theory and Techniques,* vol. MTT–32, No. 3, Mar. 1984, pp. 268–275.
"On Gain–Bandwidth Product for Distributed Amplifiers"; by Becker, et al., *IEEE Transactions on Microwave Theory and Techniques,* vol. MTT–34, No. 6, Jun. 1986, pp. 736–738.

*Primary Examiner*—Robert Pascal
*Assistant Examiner*—Henry Choe
*Attorney, Agent, or Firm*—Michael S. Yatsko

[57] ABSTRACT

A distributed amplifier topology with distributed feedback includes a plurality of amplifier stages, each of which includes a FET, MESFET or HEMT. A negative feedback network is provided with each amplifier stage which enables the gain of the distributed amplifier to be reduced by varying the negative feedback. An important aspect of the invention relates to the fact that the gain can be varied with virtually no affect on the bandwidth performance of the product and without significantly affecting the return loss, IP3 and noise figure performance of the device.

7 Claims, 5 Drawing Sheets

6,049,250

DITTRIBUTED FEED BACK DISTRIBUTED AMPLIFIER

BACKGROUND OF THE INVENTION

1. Field of the Invention

The present invention relates to a distributed amplifier topology and more particularly a distributed amplifier topology with distributed negative feedback which enables the gain of the distributed amplifier to be varied without affecting the bandwidth of the amplifier or significantly affecting the return loss, IP3 or noise figure performance.

2. Description of the Prior Art

Distributed amplifiers are generally known in the art. Examples of such distributed amplifiers are provided in detail in U.S. Pat. Nos.: 4,918,401; 4,947,136; 5,274,339; 5,386,130; 5,412,347; and U.S. Pat. No. 5,414,387. Such distributed amplifiers are also fully discussed in the literature; "MESFET DISTRIBUTED AMPLIFIER DESIGN GUIDELINES"; by Beyer, et al., *IEEE Transactions on Microwave Theory and Techniques*, Vol. MTT-32, No. 3, March 1984, pp. 268–275; "ON GAIN-BANDWIDTH PRODUCT FOR DISTRIBUTED AMPLIFIERS"; by Becker, et al., *IEEE Transactions on Microwave Theory and Techniques*, Vol. MTT-34, No. 6, June 1986, pp. 736–738, hereby incorporated by reference.

Such distributed amplifiers are known to be used at microwave frequencies because of the increased gain-bandwidth product at such frequencies relative to conventional amplifiers. A known distributed amplifier is illustrated in FIG. 1. As shown therein, the distributed amplifier, generally identified with the reference numeral 20, includes a plurality of cascaded amplifier stages 22–26, for example, n. Each amplifier stage 22–26 includes a transistor which may be a FET, MESFET or HEMT (herein after referred to as FETS for simplicity) connected in a common source configuration. All of the gate terminals of the FETS are connected together forming a gate line 28. Similarly, all of the drain terminals of the FETS are connected together forming a drain line 30. The input and output capacitance of each of the FETS is combined with lumped inductors formed, for example from microstrip lines, to form distributed impedances, 32–46, thereby forming artificial transmission lines. The use of microstrip lines for the lumped inductors makes the topology amenable to being fabricated as a microwave monolithic integrated circuit (MMIC).

The artificial transmission lines are coupled together by the transconductance of the FETS. The drain line artificial transmission line 30 is connected to A/C ground by way of a drain line termination impedance 48, selected to match the characteristic impedance of the drain line 30. Similarly, the gate line artificial transmission line 28 is terminated at a gate line termination impedance 50, selected to match the characteristic impedance of the gate line 28. Many factors are known to influence the performance of such distributed amplifiers, such as the cutoff frequency of the selected FET, the cutoff frequency of the artificial transmission lines as well as the transconductance of the selected FET. Many attempts have been made to optimize these factors to provide an optimal gain bandwidth product characteristic of the device. For example, U.S. Pat. No. 5,559,472 discloses the use of a plurality of gain cells configured in a cascade configuration in order to improve the overall gain without decreasing the bandwidth performance of the device. Unfortunately, with such topology, each gain cell includes three or more bipolar transistors which increase the overall size, cost and complexity of the device.

It is known that increasing the passband of a distributed amplifier can result in instability (i.e. oscillation) of the amplifier at increased frequencies. As such, attempts have been made to improve the stability of the distributed amplifiers resulting from improved passbands. For example, U.S. Pat. No. 5,386,130 discloses a multi-stage distributed amplifier with improved gain. In order to improve the stability of the device a low-pass filter is connected to each stage to limit the passband to frequencies where the amplifier is stable. Unfortunately, reduction of the bandwidth of a distributed amplifier is highly undesirable.

Another consideration in such distributed amplifiers is the ability to provide a distributed amplifier topology with variable gain for use in various broad band signal processing applications. Unfortunately, the gain characteristic of the distributed amplifier topologies discussed above is fixed and determined by the transconductance of the FET device. However, variable gain distributed amplifier topologies have been developed which enable the gain of the device to be varied. Examples of such variable gain distributed amplifier technologies are disclosed in U.S. Pat. Nos. 4,918,401 and 4,947,136. The '401 and '136 Patents disclose distributed amplifiers formed from a plurality of segmented dual gate FETS (SDG FETS). Such SDG FETS have an additional gate terminal divided into selectible segments of predetermined widths. Since the transconductance and thus the gain of the device is proportional to the gate width, the gain of the device can be varied by selection of the segments. Although the devices as disclosed above are known to provide adjustable gain, such devices require relatively complicated processing techniques and are also relatively large compared to known distributed amplifiers.

SUMMARY OF THE INVENTION

It is an object of the present invention to solve various problems of the prior art.

It is yet another object of the present invention to provide a distributed amplifier topology with variable gain.

It is yet another object of the present invention to provide a distributed amplifier topology with variable gain which allows the gain to be varied without affecting the bandwidth of the device.

It is yet another object of the present invention to provide a variable gain distributed amplifier topology which includes a negative feedback network for enabling the gain of the distributed amplifier to be varied.

Briefly, the present invention relates to a distributed amplifier topology with distributed feedback. The distributed amplifier topology includes a plurality of amplifier stages, each of which includes a FET, MESFET or HEMT. A negative feedback network is provided with each amplifier stage which enables the gain of the distributed amplifier to be reduced by varying the negative feedback. An important aspect of the invention relates to the fact that the gain can be varied with virtually no affect on the bandwidth performance of the product and without significantly affecting the return loss, IP3 and noise figure performance of the device.

DESCRIPTION OF THE DRAWINGS

These and other objects of the present invention will be readily understood with reference to the following specification and attached drawing wherein.

DETAILED DESCRIPTION

Figure 2:
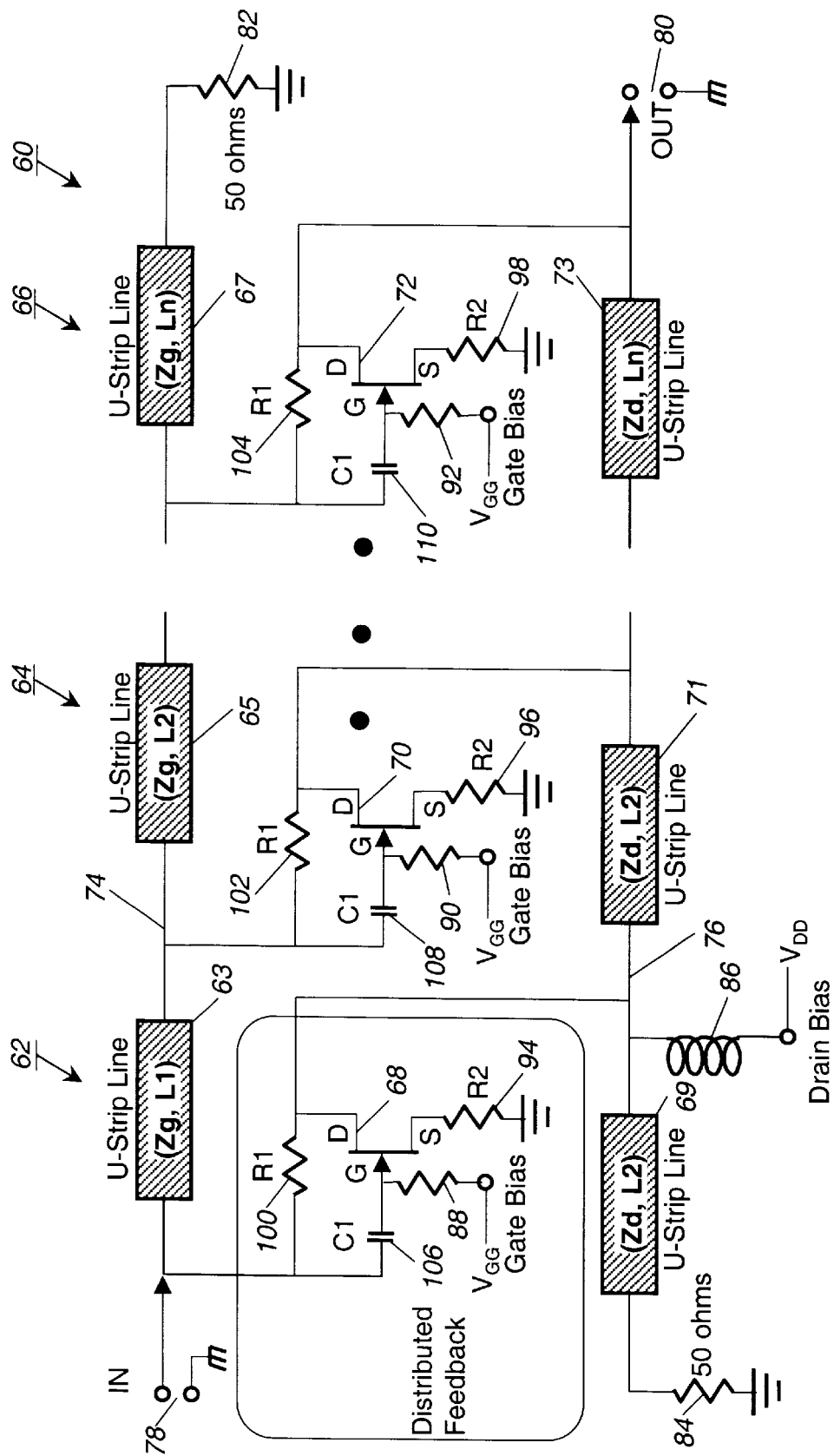
FIG. 2 is a schematic diagram of a distributed amplifier topology with distributed feedback in accordance with the present invention.

The present invention relates to a distributed amplifier topology as illustrated in FIG. 2 and identified with the reference numeral 60. An important aspect of the invention relates to a distributed feedback network which forms a part of the topology which enables the gain of the distributed amplifier to be varied without significantly affecting the noise figure, IP3 and multi-octave frequency performance of the device. Unlike other known variable gain distributed amplifiers as discussed above, the distributed amplifier 60 obviates the need for segmented dual gate FETS. Rather, distributed amplifier topology 60 may be formed from HEMTs, MESFETS and FETS (herein after referred to as FETS) utilizing relatively less complex and known processing techniques to form a monolithic microwave integrated circuit (MMIC).

Figure 1:
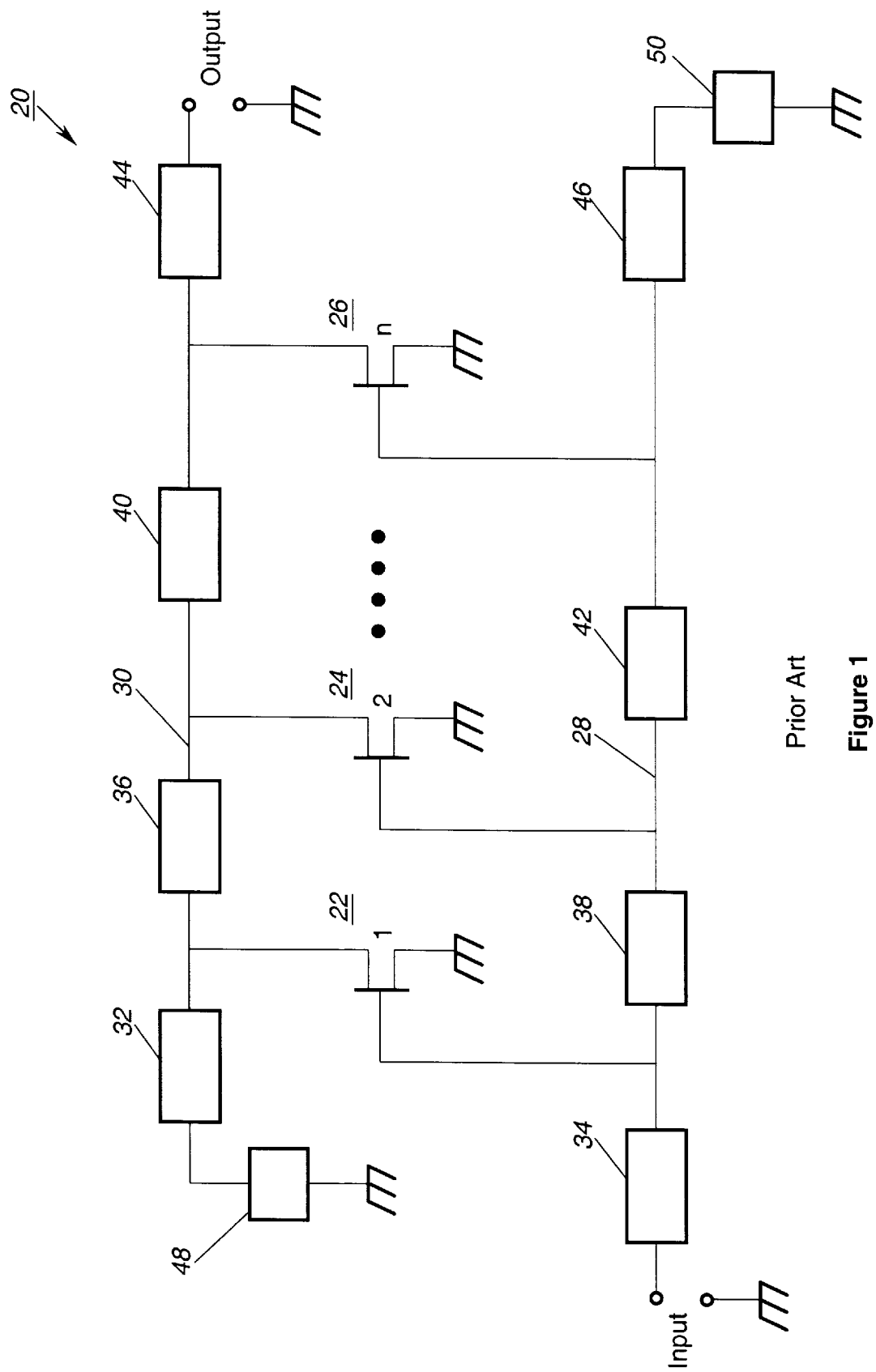
FIG. 1 is a schematic diagram of a known distributed amplifier.

Referring to FIG. 2, the distributed amplifier topology 60 in accordance with the present invention includes n amplifier stages 62, 64 and 66. Each amplifier stage 62, 64 and 66 includes a FET, MESFET or HEMT 68, 70, 72. Each FET 68, 70, 72 is configured in a common source configuration. Similar to the distributed amplifier illustrated in FIG. 1, the distributed amplifier topology 60 in accordance with the present invention is configured such that the gate terminals G of each of the FETS 68, 70 and 72 are connected to a common gate line 74. Similarly, the drain terminals D of each of the FETS 68, 70 and 72 are coupled to a common drain line 76. The gate line 74 and drain line 76 form artificial transmission lines. More particularly, the effective input capacitance for each FET 68, 70 and 72 is its respective gate to channel capacitance $C_{GS}$. Similarly, the effective output capacitance for each FET 68, 70 and 72 is its drain to source capacitance $C_{DS}$. The respective input and output capacitances for each stage 62, 64 and 66 combined with lumped inductances formed from, for example micro-strip lines 63–73, to form the artificial transmission line 74 and 76.

Input signals are applied to a pair of input terminals 78, connected to the gate line 74 and AC ground. The output of the distributed amplifier 60 is available at a pair of output terminals 80, connected to the drain line 76 and ground. A gate line termination impedance 82 is connected between the gate line 74 and ground. Similarly, a drain line termination impedance 84 is connected between the drain line 76 and AC ground. The value of the gate line termination impedance 82 is selected to match the characteristic impedance of the gate line 74. Similarly, the value of the drain line termination impedance 84 is selected to match the characteristic impedance of the drain line 76. Exemplary values of 50 Ω are illustrated in FIG. 2 for both the gate line termination impedance 82 and the drain line termination impedance 84. It is to be understood that other values for the termination impedance 82 and 84 are within the broad scope of the present invention.

In order to bias each of the transistor stages 62, 64 and 66, gate and drain biasing is provided. More particularly, a drain bias voltage $V_{DD}$ is applied to the drain line 76, for example by way of a drain bias inductance 86, which may be formed from a microstrip line. The value of the drain bias inductance 86 is a combination of an on-chip U-strip spiral inductor and off-chip Toroid inductor. The inductance value of the on-chip spiral is large enough to reactively block rf-energy in the band of 3 GHz to 20 GHz, while not too large such that its resonant point interferes with circuit operation. The off chip toroid value is chosen such that rf-energy is blocked down to 20 MHz. Gate biasing is coupled to the gate terminals G of each of the FETS 68, 70 and 72 and is resistively coupled to a gate bias voltage $V_{GG}$ by way of gate bias resistances 88, 90 and 92, respectively. The value of the gate bias resistors 88, 90 and 92 is chosen to be larger than the reactance of the dc-block capacitor at 20 Mhz, 106, 108, and 110. The purpose of the resistor is to both reduce any rf-energy feeding into the gate of the device through the gate bias network, and reduce leakage of input signal through the bias network.

An important aspect of the distributed amplifier topology 60 in accordance with the present invention relates to the negative feedback network for each amplifier stage 62, 64 and 66 which enables the gain of the amplifier 60 to be reduced. More particularly, each amplifier stage 62, 64 and 66 of the distributed amplifier topology 60 includes a common source FET 68, 70 and 72 and a negative feedback network. The negative feedback network enables the gain reduction to be distributed down the transmission lines 74 and 76. Each negative feedback network includes a source resistor 94, 96, 98, connected between the source terminal of each FETS 68, 70 and 72 and ground; a feedback resistor 100, 102 and 104 coupled between the drain terminal and the gate terminal for each FET 68, 70 and 72; and a gate dc blocking capacitor 106, 108 and 110, connected between the gate terminal and the feedback resistors 100, 102 and 104 for each FET 68, 70 and 72. The gate dc blocking capacitors 106, 108 and 110 may be formed as distributed capacitors to provide dc blocking between the gate and drain bias voltages.

The negative feedback networks provide for wide band gain reduction down the artificial transmission lines 74 and 76 and also improve the stability of the device. Since the negative feedback networks are formed from resistive elements, the gain of the amplifier can be varied (reduced) without affecting the frequency operation of the device 60, since there are no capacitors in the gate-drain feedback path. More particularly, the gain of the device 60 can be varied by varying the values of the feedback resistors 100, 102, 104 and the source resistors 94, 96, 98 down to lower frequencies (10–20 MHz) without affecting the frequency performance of the device. Additional gain reduction at lower frequencies may be achieved through a distributed capacitor divider formed between the capacitors 106, 108 and 110 and the gate to channel capacitance $C_{GS}$ of the FETs 68, 70 and 72.

Figure 3:
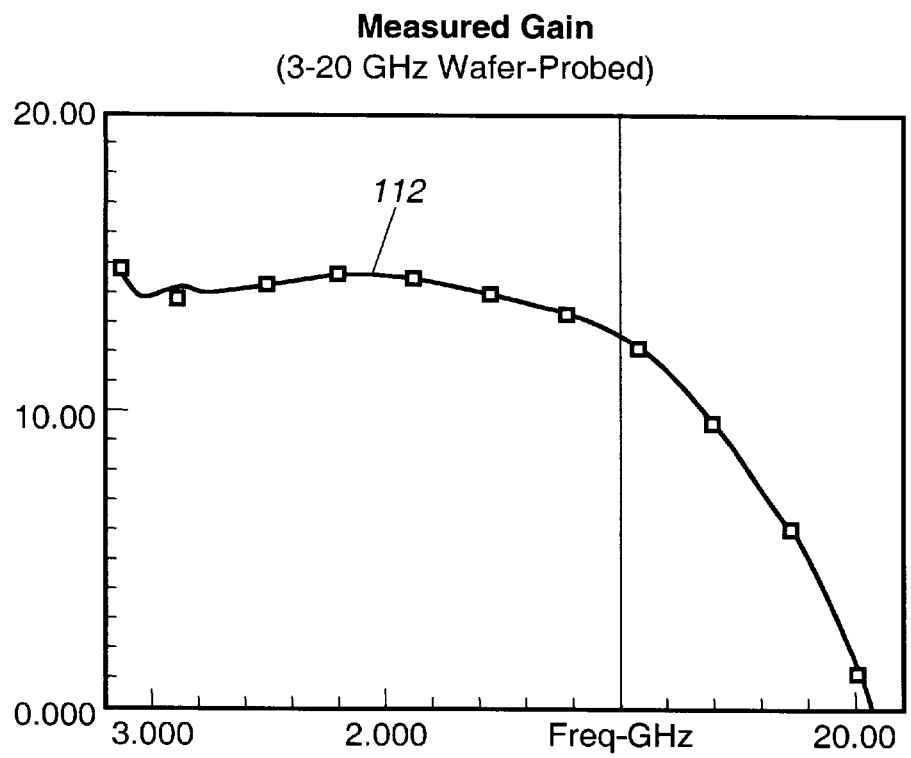
FIG. 3 is a graphical illustration of the gain as a function of frequency for a conventional distributed amplifier with no feedback.

Another important aspect of the invention is that the distributed amplifier topology 60 in accordance with the present invention enables the gain to be varied without significantly affecting the noise figure, IP3 or, return loss performance characteristics of the device. In particular, FIG. 3 represents a graphical illustration of gain as a function of frequency of a conventional distributed amplifier without feedback, such as a TRW Model No. AUH158C. The frequency range of the conventional distributed amplifier is about 20 MHz to about 14 GHz. FIG. 3 illustrates the gain characteristics in the range from 3–20 GHz. As can be seen in FIG. 3, the gain is relatively flat at about 13.5 dB between 3 and 14 GHz. The measured return losses are 14 dB maximum while the IP3 performance is 28 dbm and the noise figure is 3 dbm maximum.

Figure 4:
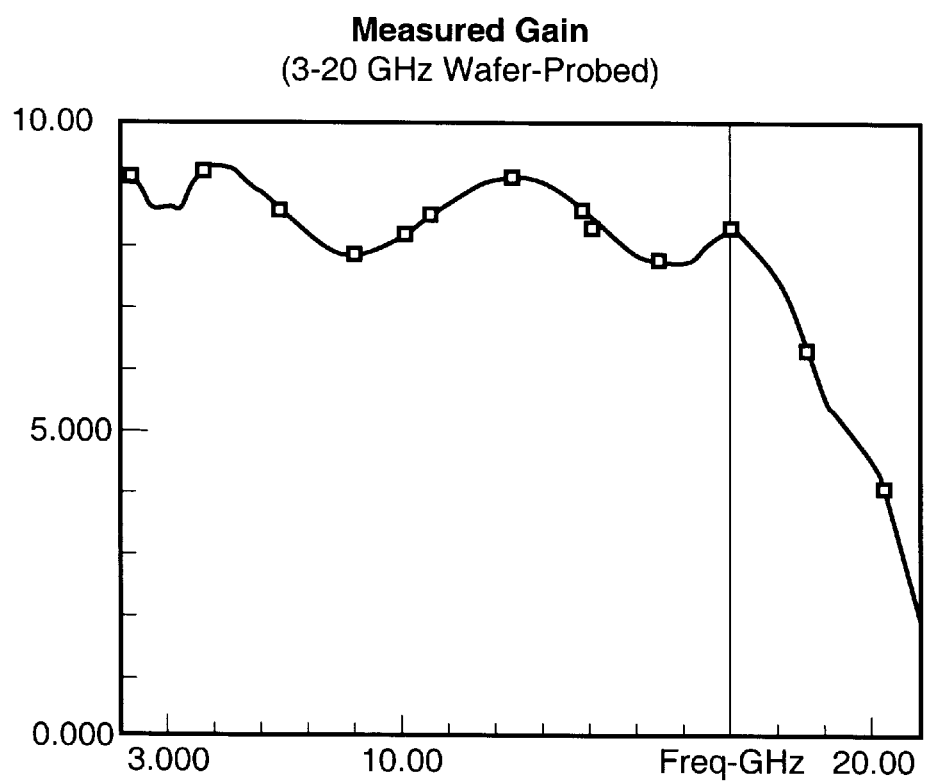
FIG. 4 is similar to FIG. 3 but for a distributed amplifier with distributed feedback in accordance with the present invention with a 5.5 dB gain reduction relative to FIG. 3.
Figure 5:
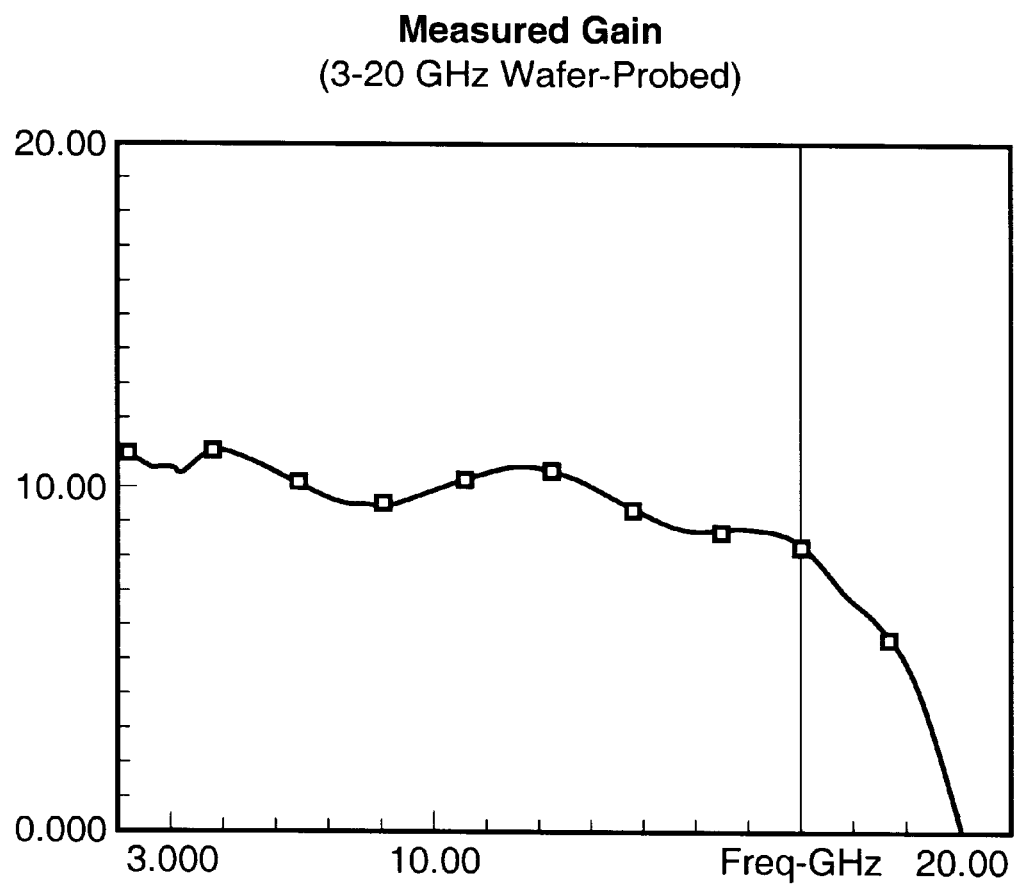
FIG. 5 is similar to FIG. 4 but with a 3 dB gain reduction.
Figure 6:
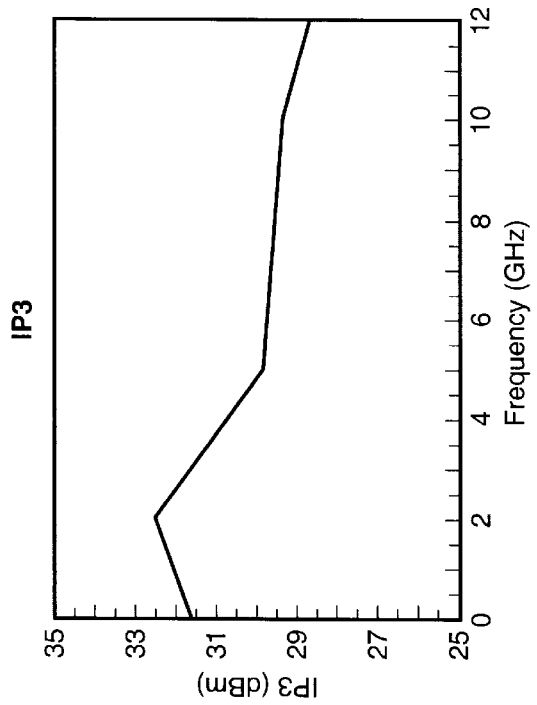
FIG. 6 is a graphical illustration of the gain as a function of frequency from 20 MHz to 12 GHz of a distributed amplifier in accordance with the present invention with distributed feedback with a 5.5 dB gain reduction relative to the conventional amplifier with no feedback illustrated in FIG. 3.
Figure 7:
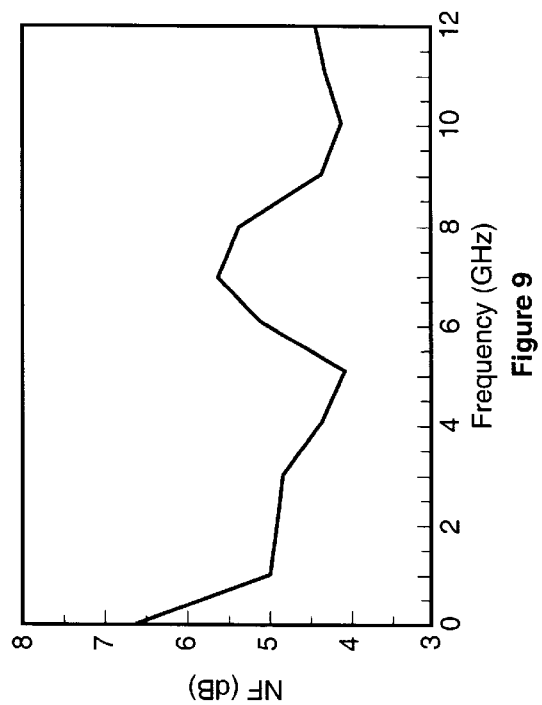
FIG. 7 is a graphical illustration of the IP3 performance as a function of frequency for a distributed amplifier with distributed feedback with a 5.5 dB gain reduction.
Figure 8:
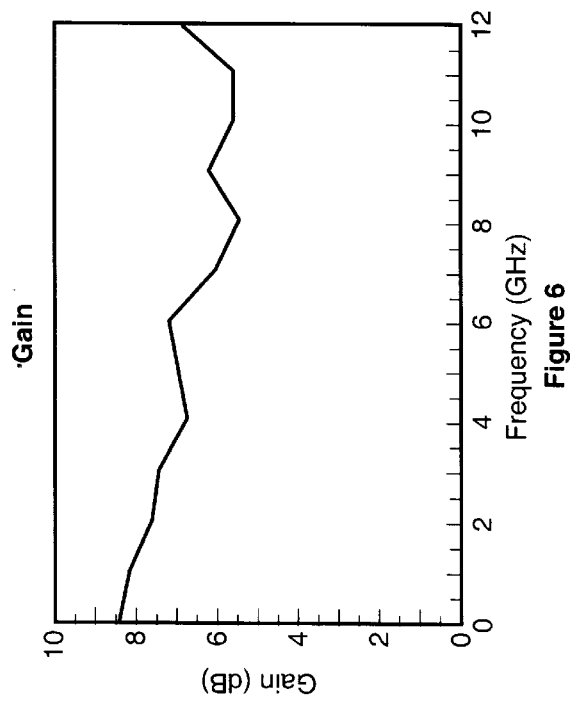
FIG. 8 is a graphical illustration of the noise figure performance for a distributed amplifier with distributed feedback with a 5.5 dB gain reduction relative to FIG. 3 for a frequency range of 20 MHz to 100 MHz.
Figure 9:
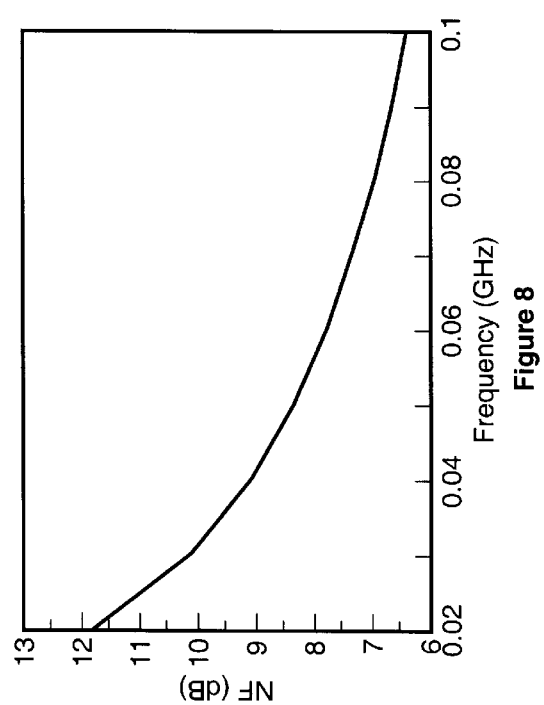
FIG. 9 is similar to FIG. 8 but for a frequency range from 20 MHz to 12 GHz.

The performance characteristics of a distributed amplifier topology 60 in accordance with the present invention for different gain characteristics is illustrated in FIGS. 4 and 5. In particular, FIG. 4 illustrates a 5.5 dB gain reduction relative to the distributed amplifier without feedback illustrated in FIG. 3. In particular, the distributed amplifier characteristics illustrated in FIG. 3 can be considered as a distributed amplifier topology in accordance with the present invention with infinite values for a feedback resistors 100, 102 and 104 while the source resistors 94, 96 and 98 are short circuited. In order to form a distributed amplifier with a 5.5 dB gain reduction relative to FIG. 3 values of 1.6 KΩ for the feedback resistors 100, 102 and 104 are selected while exemplary values of 15 Ω for the resistors 94, 96 and 98. FIG. 5 illustrates a 3 dB gain reduction relative to FIG. 3 with an exemplary values of 1.8 KΩ for the feedback resistors 100, 102 and 104 and exemplary values of 7.5 Ω for the source resistors 94, 96 and 98. FIGS. 6–9 illustrate the gain, IP3 and noise figure performance of the distributed amplifier with 5.5 dB gain reduction relative to FIG. 3.

Referring first to FIG. 4, the gain characteristic between 3 and 16 GHz is about 8.5 dB, which represents a 5.5 dB gain reduction relative to FIG. 2. Even at the reduced gain characteristic, the return loss, IP3 and noise figure performance of a distributed amplifier in accordance with the present invention is similar to the return loss, IP3 and noise figure performance of the distributed amplifier without feedback illustrated in FIG. 3. More particularly, the return loss performance for a distributed amplifier in accordance with the present invention with a 5.5 dB gain reduction relative to FIG. 3 is about 12 dB while the IP performance is about 28 dBm. Over the operating range of the distributed amplifier, 20 MHz–16 GHz, the noise figure performance is about 4.5 dB.

FIG. 5 illustrates a distributed amplifier in accordance with the present invention with a 3 dB gain reduction relative to FIG. 3. As shown, over the frequency range from 3 to 16 GHz, the gain is about 10.5 dB while the return losses are 12 dB, the IP3 performance is 30 dBm and the noise figure is 4.5 dB.

Thus, it can be seen that the distributed amplifier topology in accordance with the present invention enables the gain characteristic to be varied independent of the frequency response while having little affect on the IP3, return loss and noise figure performance. As mentioned above, the distributed amplifier topology is amenable to conventional circuit processing techniques to form a microwave monolithic integrated circuit. Gain characteristics of the distributed amplifier are changed by merely changing the values of the feedback resistors 100, 102 and 104 as well as the source resistors 94, 96 and 98 to enable distributed amplifiers with various gain characteristics to be rather easily fabricated.

Obviously, many modifications and variations of the present invention are possible in light of the above teachings. Thus, it is to be understood that, within the scope of the appended claims, the invention may be practiced otherwise than as specifically described above.

What is claimed and desired to be covered by a Letters Patent is as follows:

1. A distributed amplifier topology comprising:

an input terminal;

one or more input transmission lines coupled to said input terminal;

an output terminal;

one or more output transmission lines coupled to said output terminal;

one or more amplifier stages coupled between said one or more input transmission lines and said one or more output transmission lines; each amplifier stage including at least one field effect type transistor having gate, drain and source terminals, said field effect type transistor connected in a common source configuration, each amplifier stage further including a capacitor coupled to said gate of said field effect type transistor, said capacitor configured to form a voltage divider with the gate to source capacitance of said field effect transistor in order to reduce the gain of the amplifier stage, at least one amplifier stage including a negative feedback network;

means for biasing a plurality of said distributed amplifier stages, said biasing means coupled to said gate terminal and said capacitor;

an input line termination impedance coupled to said input transmission line; and an output line termination impedance coupled to said output transmission line.

2. The distributed amplifier topology as recited in claim 1, wherein at least one of said one or more amplifier stages includes a FET.

3. The distributed amplifier topology as recited in claim 1, wherein at least one of said one or more amplifier stages includes a MESFET.

4. The distributed amplifier topology as recited in claim 1, wherein at least one of said one or more amplifier stages includes a HEMT defining a source, gate and drain terminal.

5. The distributed amplifier topology as recited in claim 1, wherein said negative feedback network is resistive.

6. The distributed amplifier topology as recited in claim 5, wherein said negative feedback network includes a source resistor, coupled between said source terminal and ground.

7. The distributed amplifier topology as recited in claim 6, wherein said negative feedback network further includes a feedback resistor coupled between said drain and gate terminals.

* * * * *